(12) United States Patent
Matsumoto

(10) Patent No.: US 8,428,155 B2
(45) Date of Patent: Apr. 23, 2013

(54) PRINTED CIRCUIT BOARD

(75) Inventor: Shoji Matsumoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 42 days.

(21) Appl. No.: 13/253,333

(22) Filed: Oct. 5, 2011

(65) Prior Publication Data

US 2012/0093201 A1  Apr. 19, 2012

(30) Foreign Application Priority Data

Oct. 19, 2010 (JP) ................................. 2010-234734

(51) Int. Cl.
*H04B 3/00* (2006.01)
*H04L 25/00* (2006.01)

(52) U.S. Cl.
USPC .......................................... 375/257; 375/222

(58) Field of Classification Search ................... 375/219
See application file for complete search history.

(56) References Cited

U.S. PATENT DOCUMENTS

| | | | |
|---|---|---|---|
| 5,101,252 A | 3/1992 | Matsumoto | 357/30 |
| 7,355,864 B2 | 4/2008 | Matsumoto | 363/21.18 |
| 7,397,320 B1 * | 7/2008 | Bokhari | 333/1 |
| 7,564,695 B2 | 7/2009 | Matsumoto | 361/794 |
| 7,577,004 B2 | 8/2009 | Matsumoto | 363/21.12 |
| 7,595,546 B2 | 9/2009 | Matsumoto | 257/664 |
| 2005/0005184 A1 * | 1/2005 | Lindt | 713/500 |
| 2006/0197679 A1 | 9/2006 | Yamagishi et al. | 340/855.4 |
| 2008/0224922 A1 * | 9/2008 | Cleland et al. | 342/175 |
| 2011/0194871 A1 | 8/2011 | Matsumoto | 399/88 |

* cited by examiner

*Primary Examiner* — Erin File
(74) *Attorney, Agent, or Firm* — Fitzpatrick, Cella, Harper & Scinto

(57) ABSTRACT

One end of a sub transmission line of which an impedance value is equal to or higher than a parallel impedance value of an output impedance value of a transmission circuit and an impedance value of a transmission line is connected to a connection point between the transmission circuit and the transmission line, and a correction resistor of which resistance is lower than an impedance value of the sub transmission line is connected to the other end of the sub transmission line. A length of the sub transmission line is set to satisfy a condition of 0.5×Tr (signal rise time)≦Td (signal propagation time of sub transmission line)≦0.5×Tmin (signal minimum pulse width), thereby achieving a de-emphasis function by a passive component, correcting a high-frequency component of a signal attenuated on the transmission line, and thus reducing timing jitters caused by intersymbol interference.

4 Claims, 8 Drawing Sheets

PRINTED CIRCUIT BOARD

BACKGROUND OF THE INVENTION

1. Field of the Invention

The present invention relates to a printed circuit board by which signal noises, particularly intersymbol interference, can be reduced.

2. Description of the Related Art

In recent years, it becomes difficult to discriminate a symbol of a digital signal due to intersymbol interference in a transmission line on a printed circuit board as transmission speed of the digital signal in electronic equipment becomes higher, whereby an operation margin of the circuit deteriorates. Here, it should be note that the intersymbol interference is the interference which occurs between temporally adjacent digital symbols. In a case where signal transmission speed is high, a next digital signal is transmitted before the waveform of a previously transmitted digital signal converges, whereby the previously transmitted signal becomes a noise for the currently transmitted signal. In any case, it is said that, when the signal transmission speed exceeds 1 Gbps, the intersymbol interference becomes conspicuous and thus affects a circuit operation.

Subsequently, the concrete mechanism of the intersymbol interference will be described. When the signal transmission speed exceeds 1 Gbps, a high-frequency component of a signal attenuates due to a skin effect and a dielectric loss on the transmission line, and thus the waveform of the signal becomes dull. Consequently, a ratio of a rise time of the waveform to a signal period increases.

First, a state of a transmission waveform in a case where digital symbols "1" and "0" are periodically switched over is considered. That is, the waveform of the signal output from a transmission terminal is dull at a receiving end due to attenuation of the high-frequency component of the signal on the transmission line. When a symbol switchover time of the digital signal is shorter than the rise time of this signal, the switchover of the symbol starts before a signal voltage has sufficiently risen.

Next, a state of the transmission waveform in a case where the digital symbol "1" or "0" is consecutive (for example, a plurality of "1" are consecutive and are then switched over to "0", such as "1"→"1"→"1"→"0") will be described. In this case, the waveform does not completely rise in the period of the first "1", but the signal rises substantially up to a saturation voltage as the second "1" and the third "1" are consecutively arranged. Therefore, the switchover of the symbol starts from the voltage near the saturation voltage. Here, it should be noted that the saturation voltage indicates the voltage in a state that the output waveform of the transmission element has completely risen.

As just described, the voltage at the time when the symbol is switched over is different between the state that the same symbols are consecutive before the switchover and the state that the same symbols are not consecutive before the switchover. Further, after the symbol was switched over, an attaining voltage is different according to a length of the consecutiveness of the same symbols. Therefore, the attaining voltage in the period of each symbol is different according to the past state of the symbol.

In a case where the signal waveforms in the above states are displayed as the eye pattern, as illustrated in FIG. 8A, widths 801 and 802 are provided as the signal amplitudes. When the widths 801 and 802 increase, it becomes impossible to obtain the signal amplitude sufficient for the circuit operation, whereby a voltage margin of the circuit deteriorates. For this reason, to prevent such inconvenience, it is required to reduce the widths 801 and 802.

Further, when a starting voltage of a symbol change is different, a time margin of the circuit deteriorates. This is because, when the starting voltage of the symbol change is different due to the intersymbol interference, a time (timing) when the signal passes a threshold voltage by which the symbol is discriminated is different even when the signal changes by taking a same rise time. When the signal waveform in this state is displayed as the eye pattern, as illustrated in FIG. 8A, a width (timing jitter) 800 is observed at the time when the signal passes the threshold voltage. To reduce the timing jitter 800 achieves stability of the circuit operation.

Hereinafter, a technique of eliminating the above-described intersymbol interference will be explained. Since the intersymbol interference is caused by attenuation of the high-frequency component of the signal, a circuit which has a function to correct the amplitude of the high-frequency component of the signal is built into a semiconductor device, whereby the high-frequency component attenuating on the transmission line is corrected. In general terms, there are two kinds of methods of correcting the high-frequency component, that is, one is the method of correcting the high-frequency component in the semiconductor device on the transmission side, and the other is the method of correcting the high-frequency component in the semiconductor device on the receiving side.

The attaining voltage of the semiconductor device on the transmission side at the signal rise time is the saturation voltage, whereas the method of lowering, than the saturation voltage, the amplitude in the state that the symbol does not change and thus the same symbols are consecutive is called de-emphasis. In this method, since the amplitude at the signal rise time is higher than the amplitude in the state that the same symbols are consecutive, a difference between the amplitude of the high-frequency component at the signal rise time and the amplitude in the state that the same symbols are consecutive can be made small at the receiving side even if the high-frequency component at the signal rise time attenuates on the transmission line. On the other hand, the method of correcting the frequency component of the high-frequency component in the semiconductor device on the receiving side is called equalizer. In this method, a difference between the amplitude of the high-frequency component at the signal rise time and the amplitude in the state that the same symbols are consecutive can be made small by amplifying the amplitude at the signal rise time on the receiving side.

When the amplitude correction according to the signal attenuation amount on the transmission line is performed by applying such techniques as above, the amplitude of the high-frequency component which has attenuated on the transmission line can be made constant at the receiving side. Therefore, the start voltage of the symbol change can be made constant, and thus the timing jitter can be reduced.

However, when the circuit having the amplitude correction function is built into the semiconductor device, the area of the semiconductor device resultingly increases, and also power consumption resultingly increases. In consideration of such inconvenience, U.S. Patent Application Publication 2006/0197679 discloses a technique of correcting a high-frequency component of a signal by means of parts and wirings on a printed circuit board without having a correction function circuit built in a semiconductor device.

In U.S. Patent Application Publication 2006/0197679, an output terminal of a transmission circuit and an input terminal of a receiving circuit are connected through a first transmission line (transmission line), and one end of a second transmission line (high-impedance transmission line) of which the impedance is higher than that of the transmission line is connected to the connection portion between the transmission line and the input terminal of the receiving circuit. Thus, a signal amplitude at the input terminal of the receiving circuit is amplified by using a reflection occurred due to impedance mismatching at the connection portion.

Further, a terminating resistor of which the electric resistance is lower than the impedance of the high-impedance transmission line is connected to the other end of the high-impedance transmission line for termination. Thus, a negative reflection at the connection point between the high-impedance transmission line and the terminating resistor is returned to the connection portion of the transmission line and the input terminal of the receiving circuit, and the voltage at the input terminal of the receiving circuit once amplified returns to the original voltage immediately. As just described, since an edge of the signal can be steepened by increasing the amplitude at the signal rise time, it is possible to have the effect of the equalizer, whereby it is possible to reduce the timing jitter.

However, in U.S. Patent Application Publication 2006/0197679, a problem that the timing jitter could not be reduced when the output impedance of the transmission circuit and the impedance of the transmission line were not matching with each other turned out.

In U.S. Patent Application Publication 2006/0197679, the signal is amplified by using the reflection at the connection portion between the receiving circuit and the high-impedance transmission line, and a reflected wave caused by the reflection propagates also to the transmission line. For this reason, when the output impedance of the transmission circuit and the impedance of the transmission line are not matching with each other, the signal wave is again reflected at the output terminal of the transmission circuit. Thus, the signal wave obtained by adding together the reflected wave and the original signal wave newly propagates to the input terminal of the receiving circuit.

Since the signal which has been affected by such multiple reflection contributes to the intersymbol interference on the transmission line, the timing jitter increases as compared with a case where the output impedance of the transmission circuit and the impedance of the transmission line are matching with each other.

In particular, when the circuit is operated at high speed, the impedance of the transmission line is about $50[\Omega]$, and the output impedance of the transmission circuit is about 20 to $30[\Omega]$. Thus, it is often the case where the impedances of the transmission circuit and the transmission line are not matching with each other.

SUMMARY OF THE INVENTION

In these circumstances, an object of the present invention is to provide a printed circuit board in which a timing jitter caused by intersymbol interference reduces using a passive component even in a case where output impedance of a transmission circuit and impedance of a transmission line are not matching with each other.

To achieve the above object, a printed circuit board according to the present invention comprises; a transmission circuit configured to transmit a signal, a receiving circuit configured to receive a signal, a main transmission line configured to connect the transmission circuit and the receiving circuit to each other and propagate a signal from the transmission circuit to the receiving circuit, a sub transmission line, one end thereof being connected to a connection point between the transmission circuit and the main transmission line, and an impedance value thereof being equal to or higher than a parallel impedance value of an output impedance value of the transmission circuit and an impedance value of the main transmission line, and a resistor connected to the other end of the sub transmission line, resistance thereof being lower than the impedance value of the sub transmission line, wherein the sub transmission line has a length which satisfies $0.5 \times Tr \leq Td \leq 0.5 \times Tmin$, where Td is a signal propagation time required to propagate the signal from the one end to the other end of the sub transmission line, Tmin is a minimum pulse width of the signal transmitted by the transmission circuit, and Tr is a rise time of the signal transmitted by the transmission circuit.

According to the present invention, it is possible to achieve a de-emphasis function by the passive component, and it is also possible to reduce the timing jitter caused by the intersymbol interference even when the output impedance of the transmission circuit and the impedance of the main transmission line are not matching with each other.

Further features of the present invention will become apparent from the following description of exemplary embodiments with reference to the attached drawings.

DESCRIPTION OF THE EMBODIMENTS

Hereinafter, preferred embodiments of the present invention will now be described in detail with reference to the attached drawings.

First Embodiment

Figure 1A:
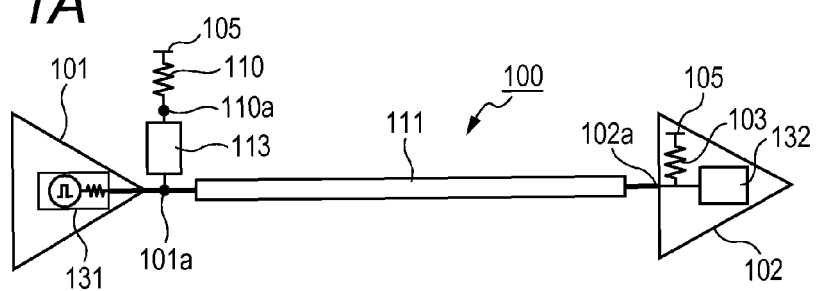
FIGS. 1A, 1B, 1C, 1D and 1E are explanatory diagrams illustrating a schematic constitution of a printed circuit board according to a first embodiment.
Figure 1B:
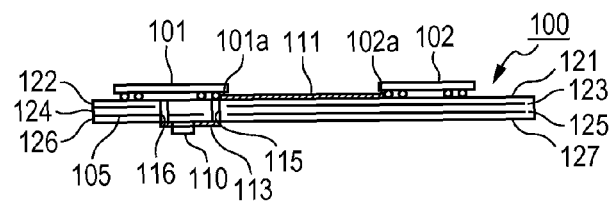
Figure 1C:
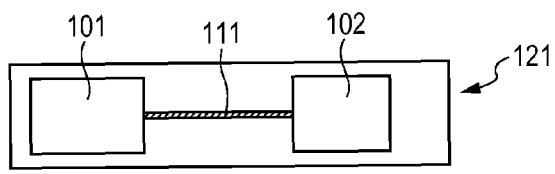
Figure 1D:
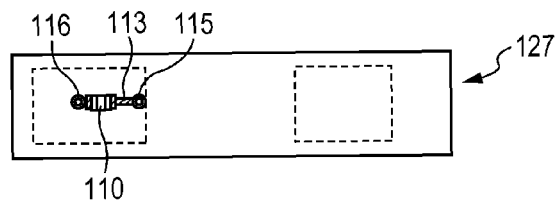
Figure 1E:
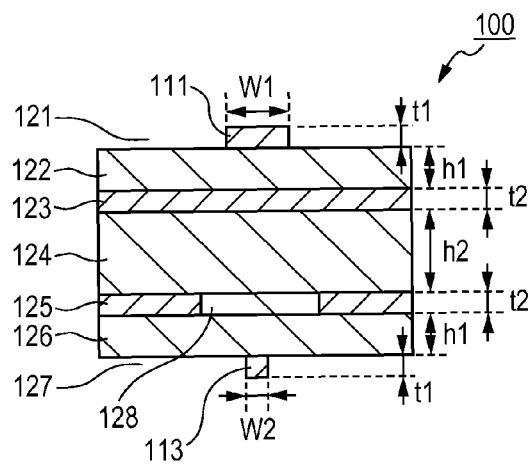

FIGS. 1A, 1B, 1C, 1D and 1E are explanatory diagrams illustrating a schematic constitution of a printed circuit board according to a first embodiment of the present invention. FIG. 1A illustrates an equivalent circuit of the printed circuit board. FIG. 1B is a cross-sectional view of the printed circuit board illustrated along the direction parallel with a main transmission line, and FIGS. 1C and 1D are plan views of signal wiring layers respectively formed on upper and rear surfaces of the printed circuit board. FIG. 1E is a cross-sectional view illustrated along the direction orthogonal to the main transmission line of the printed circuit board.

As indicated in FIG. 1A, a printed circuit board 100 has a transmission device 101, which has a built-in transmission circuit 131 for transmitting a signal, and a receiving device 102, which has a built-in receiving circuit 132 for receiving a signal. A signal output by the transmission circuit 131 is a digital signal, which is switched to a low level or a high level of the voltage.

The printed circuit board 100 has a transmission line 111 serving as the main transmission line for connecting an output terminal of the transmission circuit 131 of the transmission device 101 with an input terminal of the receiving circuit 132 of the receiving device 102. Therefore, the printed circuit board 100 adopts a single-ended transmission system.

The transmission circuit 131 can be regarded as a signal source having internal resistance. The output terminal of the transmission circuit 131 is connected with one end of the transmission line 111 at a connection point 101a. The input terminal of the receiving circuit 132 is connected with the other end of the transmission line 111 at a connection point 102a. A signal transmitted from the transmission circuit 131 is received by the receiving circuit 132 after propagating it through the transmission line 111.

The receiving device 102 has a built-in terminating resistor 103 of which one end is connected to the connection point 102a, and the other end of the terminating resistor 103 is connected to a wiring 105, to which the termination voltage (e.g., power supply voltage) is applied. Incidentally, although the built-in terminating resistor 103 is in the receiving device 102, the terminating resistor 103 may be arranged on a signal wiring layer separating from the receiving device 102 as a different member. Although it will be described about a case where the termination voltage is the power supply voltage, it is sufficient that the voltage is a stable constant-voltage, and the ground voltage may be also available.

Here, an impedance of the transmission line 111 generally changes within a range of ±10% of a designed value depending on variations in a manufacturing process. Accordingly, an error range of a resistance value of the terminating resistor 103 is allowed within a range of ±10% to the impedance of the transmission line 111.

In the first embodiment, the printed circuit board 100 has a correction line 113 serving as a sub transmission line provided at a side of the transmission circuit 131 and a correction resistor 110 serving as a resistor. One end of the correction line 113 is connected to the connection point 101a, where the output terminal of the transmission circuit 131 is connected with the one end of the transmission line 111. The other end of the correction line 113 is connected with one end of the correction resistor 110 at the connection point 101a. The other end of the correction resistor 110 is connected to the wiring 105, to which the termination voltage (e.g., power supply voltage) is applied.

Next, the structure of the printed circuit board 100 will be described with reference to FIGS. 1B, 1C and 1D. The printed circuit board 100 is formed to have the laminated structure, where insulating layers 122, 124 and 126 are respectively placed between a signal wiring layer 121 and a ground layer 123, between the ground layer 123 and a power supply layer 125, and between the power supply layer 125 and a signal wiring layer 127. In the first embodiment, the signal wiring layer 121 is an upper surface layer, the signal wiring layer 127 is a rear surface layer, and the ground layer 123, the power supply layer 125 and the insulating layers 122, 124 and 126 are interlayers.

The transmission device 101, the receiving device 102 and the transmission line 111 are arranged on the signal wiring layer 121, which is an upper surface layer, as indicated in FIGS. 1B and 1C. The correction resistor 110 and the correction line 113 are arranged on the signal wiring layer 127, which is a rear surface layer, as indicated in FIGS. 1B and 1D. And, the connection between the transmission device 101 and the correction line 113 is completed through a VIA 115.

The wiring 105, to which the power supply voltage serving as the termination voltage is applied, is arranged on the power supply layer 125 which is an interlayer, and the connection between the correction resistor 110 and the wiring 105 is completed through a VIA 116. Incidentally, it is omitted to illustrate the VIA 115 and the VIA 116 in FIG. 1A.

Next, the layer structure of the printed circuit board 100 will be described with reference to FIG. 1E. The transmission line 111 is arranged on the signal wiring layer 121 of which thickness is t1. The thickness of the insulating layer 122 is h1. The thickness of the ground layer 123 is t2. The thickness of the insulating layer 124 is h2. The thickness of the power supply layer 125 is t2. The thickness of the insulating layer 126 is h1. The correction line 113 is arranged on the signal wiring layer 127 of which thickness is t1.

An aperture 128 is formed at a position, where the power supply layer 125 is opposite to the correction line 113, and the inside of the aperture 128 is filled up with an insulator having the same quality as that of the insulating layer 124. Therefore, an impedance reference plane of the correction line 113 becomes the ground layer 123.

Next, it will be described about a principle, by which the timing jitter in the printed circuit board 100 of the first embodiment is reduced. It is defined that a value of internal resistance (output impedance) of the transmission circuit 131 indicated in FIG. 1A is represented by R101 [Ω]. In addition, it is defined that an impedance value of the transmission line 111 is represented by Z111 [Ω], an impedance value of the correction line 113 is represented by Z113 [Ω], a resistance value of the correction resistor 110 is represented by R110 [Ω] and a resistance value of the terminating resistor 103 is represented by R103 [Ω].

Relationship between respective parameters is defined that R103=Z111, Rp≦Z113, and R110<Z113. Here, Rp denotes a parallel impedance value obtained from the impedance value Z111 of the transmission line 111 and the impedance value R101 of the transmission device 101, and the Rp is expressed by an expression of Rp=(Z111×R101)/(Z111+R101). That is, the impedance value Z113 of the correction line 113 is set to become equal to or larger than the parallel impedance value Rp obtained from the impedance value Z111 of the transmission line 111 and the impedance value R101 of the transmission device 101. In addition, the resistance value R110 of the correction resistor 110 is set to become lower than the impedance value Z113 of the correction line 113. In addition, the resistance value R103 of the terminating resistor 103 is set to become equal to the impedance value Z111 of the transmission line 111.

Here, it is defined that a reflection coefficient when a signal, which propagates through the correction line 113 from a connection point 110a (the other end) to the connection point 101a (one end), reflects at the connection point 101a (one end) is represented by γ1. And, it is defined that a reflection coefficient when a signal, which propagates through the correction line 113 from the connection point 101a (one end) to the connection point 110a (the other end), reflects at the connection point 110a (the other end) is represented by γ2. The reflection coefficients γ1 and γ2 are respectively expressed by the following expressions (1) and (2).

$$\gamma 1=(Rp-Z113)/(Rp+Z113) \quad (1)$$

$$\gamma 2=(R110-Z113)/(R110+Z113) \quad (2)$$

Generally, values of γ1 and γ2 respectively becomes to be in ranges of $-1 \leq \gamma 1 \leq 1$, and $-1 \leq \gamma 2 \leq 1$, however, in the present embodiment, a value of γ1 becomes to be in a range of $-1 < \gamma 1 \leq 0$ in order to set to the relationship of Rp≤Z113, and a value of γ2 becomes to be in a range of $-1 < \gamma 2 < 0$ in order to set to the relationship of R110<Z113.

It is defined that a minimum pulse width of a signal transmitted by the transmission circuit 131 is represented by Tmin [sec], a rise time of the signal is represented by Tr [sec] and the voltage amplitude at the connection point 101a (one end of the correction line 113) is represented by V1 [V]. And, it is defined that a signal propagation time required in that the signal propagates through the correction line 113 from the connection point 101a (one end) to the connection point 110a (the other end) is represented by Td [sec].

Hereinafter, it will be described about behavior of the voltage amplitude V1 with respect to a case where a value of the signal propagation time Td becomes such a value of satisfying a condition of Td=0.5×Tmin. First, it will be described about a case where a signal is output from the transmission circuit 131 of the transmission device 101 and then a digital symbol changes from "0" to "1". The amplitude of a signal (voltage) at the connection point 101a changes toward the saturation voltage, and the signal propagates to the transmission line 111 and the correction line 113. The initial voltage of the V1 at this time is defined as V1o. A signal propagated through the transmission line 111 does not reflect at the connection point 102a since the impedance is matching under the condition of Z111=R103.

On the other hand, a signal propagated to the correction line 113 reflects at the connection point 110a. Since the resistance value R110 and the impedance value Z113 is in such a state of R110<Z113 ($-1 < \gamma 2 < 0$), a negative reflection is generated, and a reflected wave returns to the connection point 101a. Since the signal propagation time Td is expressed by Td=0.5×Tmin, a time required in propagating through a route from the connection point 101a to the connection point 110a and to the connection point 101a becomes such a time of Tmin to be resulted in coinciding with a minimum pulse width of indicating a digital symbol of "1".

In a case where the digital symbols "1" are consecutive, since a reflected wave (γ2×V1o) at the connection point 110a and a reflected wave (γ1×γ2×V1o) of a signal, which was reflected at the connection point 110a, at the connection point 101a are added to the initial voltage V1o of the V1, as for the amplitude of a signal (voltage) indicating a second digital symbol of "1", the voltage is more decreased as compared with the amplitude of a signal (voltage) indicating a first digital symbol of "1". When it is defined that the voltage when the reflected wave was added with a state of Tmin is represented by V1', the following expression is obtained.

$$V1'=(1+\gamma 2+\gamma 1\times \gamma 2)\times V1o \quad (3)$$

Since there are conditions of $-1 < \gamma 2 < 0$ and $-1 < \gamma 1 \leq 0$ as preconditions, an absolute value of γ2×V1o becomes larger than an absolute value of γ1×γ2×V1o to be resulted in V1o>V1'. Therefore, this state is a de-emphasis state, where the amplitude in a steady state is decreased for the amplitude at a time of the signal rising.

On the other hand, in a case where a digital symbol changes from "1" to "0", a signal from the transmission device becomes a state of "0" after that the pulse width is in a state of the Tmin, and since a value expressed by (γ2+γ1×γ2)×V1o is added to the above-described state, the amplitude at the connection point 101a decreases to a level lower than that of the amplitude of a signal indicating a digital symbol of "0" in a steady state.

If the digital symbols "0" are further consecutive after this state, since a negative reflection to a falling signal, that is, the positive amplitude is added, the amplitude increases to a level higher than that the amplitude of a signal (voltage) indicating a digital symbol of "0" at a time of the signal falling. This state is a de-emphasis state, where the amplitude in a steady state is increased for the amplitude at a time of the signal falling.

Although the above-described principle has been described by an expression of Td=0.5×Tmin, if the present invention is applied to a portion, where numerous high-frequency components are contained, an effect of de-emphasis can be obtained. Accordingly, since it is effective that the subsequent amplitude is relatively decreased for the amplitude just after the signal rising, it is preferable that at least the amplitude at a signal rising time becomes such a level higher than that of the subsequent amplitude.

Therefore, a length of the correction line 113 may be set within such a range, where the signal propagation time Td becomes such a value which satisfies the condition of the following expression (4).

$$0.5\times Tr \leq Td \leq 0.5\times Tmin \quad (4)$$

Specifically, when it is defined that a dielectric constant of the insulator of the insulating layers 122, 124 and 126 is represented by ∈r and a length of the correction line 113 is represented by Len113, the length Len113 of the correction line 113 is determined by the following expression (5).

$$Len113 \approx (co/\sqrt{\in r})\times Td \quad (5)$$

Here, the above sign co corresponds to a value of velocity of light. Therefore, when a value of the signal propagation time Td is determined such that the signal propagation time Td satisfies the condition of the expression (4), the length Len113 of the correction line 113 is obtained by the expression (5). By setting the length of the correction line 113 to this obtained value, an effect of de-emphasis can be obtained.

As described above, since the present invention utilizes an effect of de-emphasis, when a signal at the connection point 101a propagates through the transmission line 111 and reaches the connection point 102a, even if the high-frequency component is attenuated, difference in the voltage values when the signal is completely risen becomes a small difference in the case where the digital symbols are consecutive and the case where the digital symbols are not consecutive. Similarly, difference in the voltage values when the signal is completely fallen becomes a small difference in the case where the digital symbols are consecutive and the case where the digital symbols are not consecutive. Therefore, the dispersion of the voltage when the signal begins to rise and when the signal begins to fall becomes small dispersion. Therefore, a timing lag in reaching a threshold voltage to be used to judge if the signal is in a state of "0" or "1" in the receiving circuit 132, that is, a timing jitter is reduced.

The correction line 113 and the correction resistor 110 are passive components. In this manner, a de-emphasis function can be realized by the passive components. Although an output impedance of the transmission circuit 131 is not matching with an impedance of the transmission line 111, since the matching termination is realized by the terminating resistance at the connection point 102a at a side of the receiving circuit 102, the signal is not reflected at the connection point 102a. Therefore, since the reflected wave does not return to a side of the transmission circuit 101 from a side of the receiving circuit 102, the signal is not re-reflected at the connection point 101a, and the impedance mismatching at the connection point 101a does not give a harmful influence to a wave form.

Next, it will be described in detail about the relationship between the impedance value Z113 of the correction line 113 and the resistance value R110 of the correction resistor 110. The impedance value Z113 of the correction line 113 and the resistance value R110 of the correction resistor 110 are determined by the magnitude of de-emphasis required to be controlled and the magnitude of voltage (voltage which can be received at a receiving device) which is in a steady state.

Since a control of the magnitude of de-emphasis is a control of the voltage amplitude at the connection point 101a when the reversed symbols are initially consecutive after the digital symbols are reversed, this control can be described by the expression (3). And, since the voltage in a steady state is such the voltage which is in the case where the reversed symbols are infinitely consecutive, the description can be given as follows.

It is defined that the symbols "1" are consecutive after the symbol is changed from "0" to "1" and the amplitude (voltage) in the third period is represented by V1". The voltage V1" becomes equivalent to the sum of the voltage (V1') in the previous period at the connection point 101a, a reflected wave ($\gamma 2 \times (\gamma 1 \times \gamma 2 \times V1o)$) at the connection point 110a of a reflected wave from the previous period and a reflected wave ($\gamma 1 \times \gamma 2 \times (\gamma 1 \times \gamma 2 \times V1o)$) at the connection point 101a of that reflected wave. Therefore, the voltage V1" becomes to be expressed by the following expression.

$$\begin{aligned} V1'' &= V1' + \gamma 2 + (\gamma 1 \times \gamma 2 \times V1o) + \gamma 1 \times (\gamma 2 \times (\gamma 1 \times \gamma 2) \times V1o) \\ &= (1 + \gamma 2 + \gamma 1 \times \gamma 2) \times V1o + \gamma 2 \times (\gamma 1 \times \gamma 2 \times V1o) + \\ &\quad \gamma 1 \times (\gamma 2 \times (\gamma 1 \times \gamma 2 \times V1o)) \\ &= \{1 + \gamma 2 + \gamma 1 \times \gamma 2 + \gamma 1 \times \gamma 2^2 + (\gamma 1 \times \gamma 2)^2\} V1o \\ &= [1 + (1 + \gamma 1) \times \gamma 2 + \{(1 + \gamma 1) \times \gamma 2 \times (\gamma 1 \times \gamma 2)\}] V1o \end{aligned}$$

Thereafter, when the symbols "1" are consecutive, the refection is repeated to be converged to the steady voltage. The voltage V1x in a steady state (after elapsing infinite time) becomes equivalent to the sum of an infinite geometric series, of which a common ratio is equal to $\gamma 1 \times \gamma 2$, comprises the amplitude V1o at a time of the signal rising and a first term equal to $(1+\gamma 1) \times \gamma 2$. Therefore, the voltage V1x in a steady state is expressed by the following expression (6).

$$\begin{aligned} V1x &= \{1 + (1+\gamma 1) \times \gamma 2 / (1 - \gamma 1 \times \gamma 2)\} \times V1o \\ &= (1 + \gamma 2) / (1 - \gamma 1 \times \gamma 2) \times V1o \end{aligned} \quad (6)$$

As described above, as to the magnitude of de-emphasis required to be controlled and the voltage in a steady state, a relational expression with circuit parameters has been described. Subsequently, it will be described about controls of the voltages V1' and V1x.

Figure 2A:
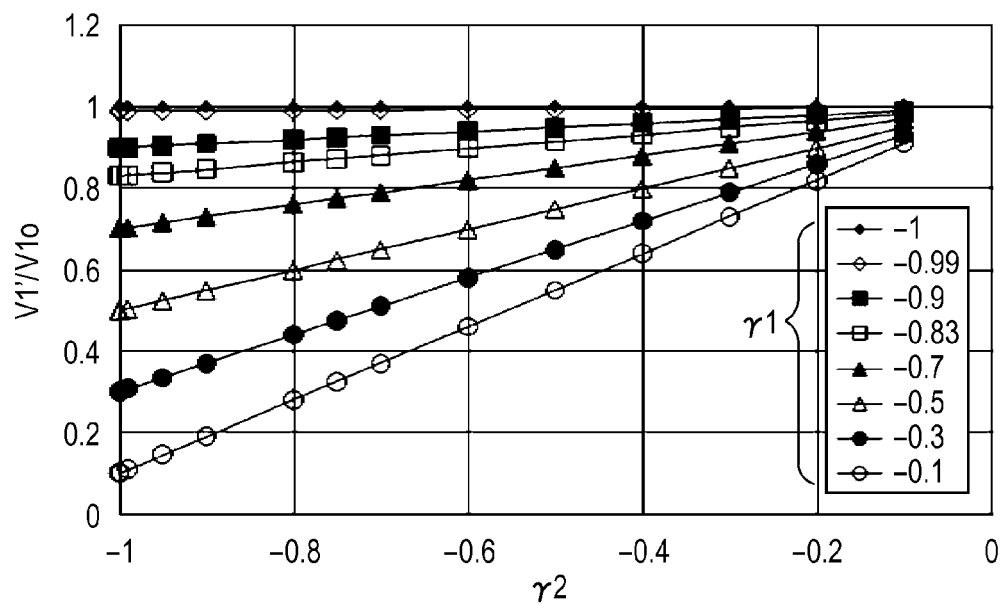
FIGS. 2A and 2B are graphs concerning reflection coefficients γ1 and γ2 of a sub transmission line according to the first embodiment.
Figure 8A:
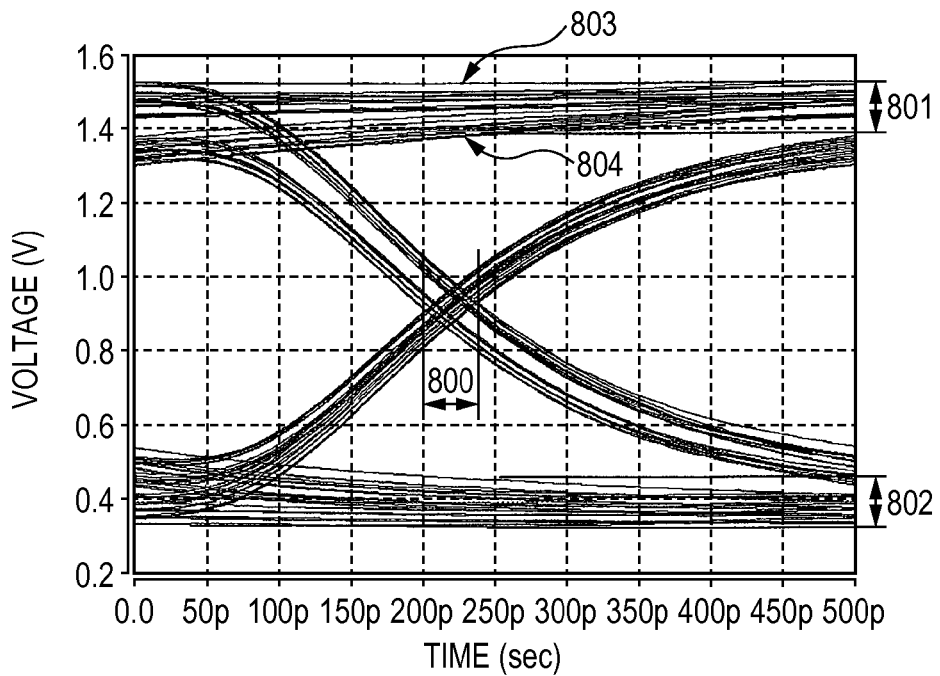
FIGS. 8A and 8B are graphs respectively indicating simulation results of the printed circuit board according to a comparative example.

First, it will be described about a control of the voltage V1'. A graph formed in that an amplitude ratio V1'/V1o is plotted on a vertical axis, the reflection coefficient $\gamma 2$ is plotted on a horizontal axis and parameters are treated as the reflection coefficient $\gamma 1$ is indicated in FIG. 2A. Incidentally, the de-emphasis amplitude required in the correction of signal attenuation is obtained from an amplitude ratio between the minimum voltage 804 and the maximum voltage 803 at a cross-point vicinity of an eye pattern in a waveform to which the amplitude correction by the de-emphasis indicated in FIG. 8A is not performed.

Here, when a transmission rate Bv of the transmission line 111 is defined as Bv=(minimum voltage 804)/(maximum voltage 803), if the condition of the following expression (7) is satisfied, an effect of de-emphasis of correcting the signal attenuation in the transmission line 111 can be obtained. Incidentally, the transmission rate Bv is such a value which indicates that what percentage of an output signal is propagated to the connection point 102a serving as a receiving end without attenuating, and this value may be previously calculated. Note that the Bv is in a state of Bv<1.

$$V1'/V1o = 1 + \gamma 2 + \gamma 1 \times \gamma 2 = Bv \quad (7)$$

A voltage difference between the maximum voltage and the minimum voltage can be reduce to a small difference at the connection point 102a by setting the reflection coefficients $\gamma 1$ and $\gamma 2$ to satisfy the expression (7), and the timing jitter can be effectively reduced. Here, since the reflection coefficients $\gamma 1$ and $\gamma 2$ are determined by the setting of the impedance value Z113 and the resistance value R110 as indicated in the expressions (1) and (2), if the impedance value Z113 and the resistance value R110 are set so as to satisfy the expression (7), the timing jitter can be effectively reduced. Incidentally, it is not required to satisfy the expression of V1'/V1o=Bv strictly, and the ratio V1'/V1o (that is, Z113 and R110) can be adjusted within a range, where the timing jitter can be reduced, to be described later.

Figure 2B:
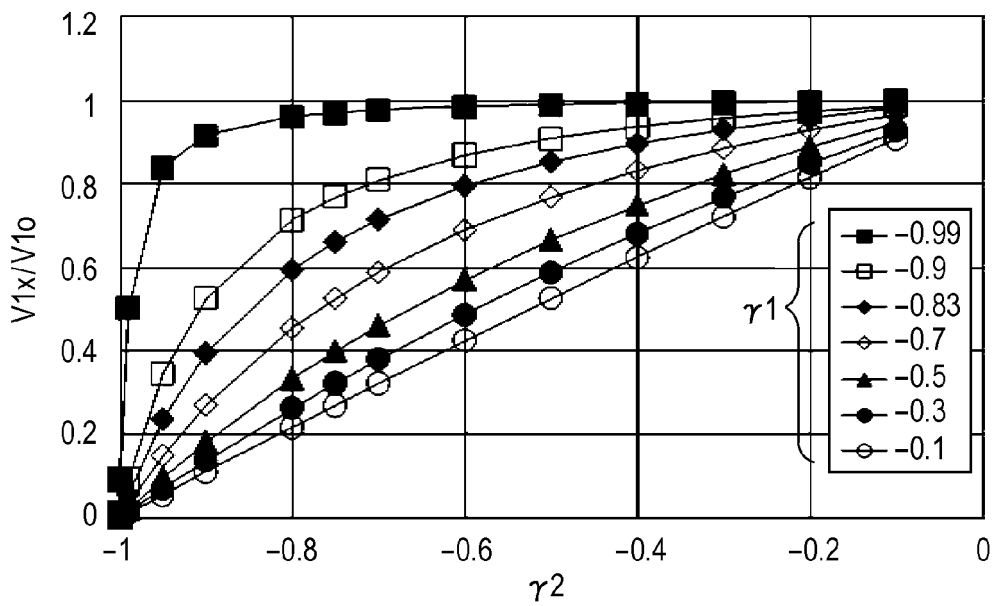

It will be described about the control of the voltage V1x. A graph formed in that an amplitude ratio V1x/V1o is plotted on a vertical axis, the reflection coefficient $\gamma 2$ is plotted on a horizontal axis and parameters are treated as the reflection coefficient $\gamma 1$ is indicated in FIG. 2B. As indicated in FIG. 2A, when the reflection coefficient $\gamma 2$ is reduced to a small value (that is, the resistance value R110 of the correction resistor 110 is reduced to small value), the de-emphasis amplitude becomes a large amount. However, if the reflection coefficient $\gamma 2$ is reduced to a too small value, the voltage V1x becomes too small as indicated in FIG. 2B, and the voltage V1x becomes equal to or lower than the receivable threshold voltage value at the receiving circuit 132 of the receiving device 102.

Here, it is defined that a ratio indicated by such a fractional expression, where a width of the output saturation voltage of the transmission circuit 131 of the transmission device 101 is set as a denominator and a width of the input threshold voltage of the receiving circuit 132 of the receiving device is set as a numerator, is represented by Av. That is, it is defined that Av=(input threshold voltage of a receiving device)/(output saturation voltage of a transmission device).

That is, a width between the output saturation voltage at a high level side of the transmission circuit 131 and the output saturation voltage at a low level side becomes a denominator of the ratio Av. In the receiving circuit 132, the input threshold voltage at a high level side of judging a received signal as a digital symbol "1" and the input threshold voltage at a low level side of judging a received signal as a digital symbol "0" are set. Therefore, a width between the input threshold voltage at a high level side and the input threshold voltage at a low level side becomes a numerator of the ratio Av. This ratio Av is determined by the standard of the transmission device 101 and the receiving device 102.

For example, the SSTL__18 (Stub Series Terminated Logic for 1.8 [V]) can be enumerated as one of the high speed transmission standard. As for the standard of the SSTL__18, the input threshold voltage has a width of ±0.25 [V] around 0.9 [V] for the amplitude range 0.9±0.9 [V] (0 to 1.8 [V]) of the output saturation voltage. Therefore, the ratio Av in this case is about 0.28. Here, it is required to be Av<Bv.

An amplitude ratio (V1$x$/V1$o$) of the amplitude in a steady state for the amplitude at a time of the signal rising becomes to be expressed as $(1+\gamma 2)/(1-\gamma 1 \times \gamma 2)$ by the expression (6). The condition in order that an effect of de-emphasis does not become too large is that the amplitude ratio (V1$x$/V1$o$) becomes equal to or larger than the ratio Av. Therefore, the amplitude ratio is in such a relationship expressed by the following expression (8).

$$(1+\gamma 2)/(1-\gamma 1 \times \gamma 2) \geq Av \qquad (8)$$

When it is collectively described, in order to control the amplitude ratios V1'/V1$o$ and V1$x$/V1$o$, the impedance value Z113 and the resistance value R110 are respectively set within ranges of $-1 < \gamma 1 \leq 0$ and $-1 < \gamma 2 < 0$ so as to satisfy the conditions of the expression (7) and the expression (8) under the condition of 0<Av<Bv<1. Either the impedance value Z113 or the resistance value R110 is not uniquely determined, but the impedance value Z113 and the resistance value R110 are adjusted each other so as to satisfy the conditions of the expression (7) and the expression (8).

As above, since the impedance value Z113 of the correction line 113 and the resistance value R110 of the correction resistor 110 are set, the voltage at a high level side of a signal to be received in the receiving circuit 132 becomes equal to or larger than the input threshold voltage at the high level side even if the digital symbols "1" are consecutive. Also, the voltage at a low level side of a signal to be received in the receiving circuit 132 becomes equal to or lower than the input threshold voltage at the low level side even if the digital symbols "0" are consecutive.

Example 1

An effect of the first embodiment will be indicated by the computer simulation. Parameters of the respective portions used in the simulation will be indicated in the following description. First, parameters of the transmission device 101 will be indicated. An operation frequency was set as 2 [Gbps] (minimum pulse width Tmin was set as 500 [psec]), an amplitude range of the output saturation voltage was set as 0.9±0.9 [V] and the output impedance value R101 of the transmission circuit 131 was set as 20[Ω]. In addition, an output signal rising time (falling time) Tr was set as 100 [psec].

Next, parameters of the transmission line 111 will be indicated. The length of the transmission line 111 was set as 700 [mm] and the impedance value Z111 of the transmission line 111 was set as 50[Ω]. Next, parameters of the receiving circuit 132 will be indicated. The input threshold voltage was set as 0.9±0.25 [V], the resistance value R103 of the terminating resistor 103 was set as 50[Ω], and the termination voltage was set as 0.9 [V]. Next, parameters of the correction line 113 and the correction resistor 110 will be indicated. The impedance value Z113 of the correction line 113 was set as 150[Ω] and the resistance value R110 of the correction resistor 110 was set as 50[Ω].

As for the dimensions in the cross-sectional structure of the printed circuit board 100, the thickness t1 of each of the signal wiring layers 121 and 127 was set as 0.043 [mm], the thickness h1 of each of the insulating layers 122 and 126 was set as 0.1 [mm], the thickness h2 of the insulating layer 124 was set as 1.2 [mm]. The thickness t2 of each of the ground layer 123 and the power supply layer 125 was set as 0.035 [mm] and the dielectric constant ∈r of the insulator was set as 4.3. The wiring width W1 was set as 0.135 [mm] and the wiring width W2 was set as 0.1 [mm].

The impedance value Z111 of the transmission line 111 has the relationship with the dimensions in the cross-sectional structure of the printed circuit board 100, and the relationship is generally determined by the following expression.

$$Z111 \approx \{60/\sqrt{(0.475 \times \in r + 0.67)}\} \times \ln\{4 \times h1/(0.67 \times (0.8 \times W1 + t1))\}$$

At this time, since the wiring width W1 was set as 0.135 [mm], the impedance value Z111 of the transmission line 111 becomes 50[Ω]. That is, a case where the output impedance value R101 (=20[Ω]) of the transmission circuit 131 is not matching with the impedance value Z111 (=50[Ω]) of the transmission line 111 is supposed.

Since the aperture 128, which is placed on a position opposite to the correction line 113 in the power supply layer 125, is filled up with the insulator, a distance to the ground layer 123 serving as a reference layer becomes equal to 1.335 [mm]. In this case, the wiring width W2 becomes equal to 0.1 [mm], and the impedance value Z113 becomes equal to 150 [Ω].

Here, the signal propagation time Td in the correction line 113 was set as 250 [psec], which becomes correspond to 0.5×Tmin. Since the dielectric constant ∈r of the insulator is equal to 4.3, the length L113 of the correction line 113 becomes to be expressed as Len113≈(co/√∈r)×Td=36 [mm] by the expression (2). Note that the above sign co corresponds to a value of velocity of light, and the co was set as co≈3.0×10$^8$ [m/sec].

The values of Z113 and R113 are set in consideration of the weakening (transmission rate Bv) of a signal waveform due to the characteristics of the transmission line 111. In a waveform, to which the amplitude correction by the de-emphasis indicated in FIG. 8A is not performed, the minimum voltage 804 becomes equal to 1.38 [V] and the maximum voltage 803 becomes equal to 1.53 [V] at a cross-point vicinity of an eye pattern of a receiving end, and the Bv is equal to 0.90.

Values which are determined by the parameters enumerated in the above description are as follows. Rp=R101/Z111=14.3[Ω], γ1=−0.83, γ2=−0.5, and Av=0.28, and, V1'/V1$o$=0.915≈Bv=0.9, V1$x$/V1$o$=0.85>Av=0.28, and the above values satisfy the conditions.

Figure 3A:
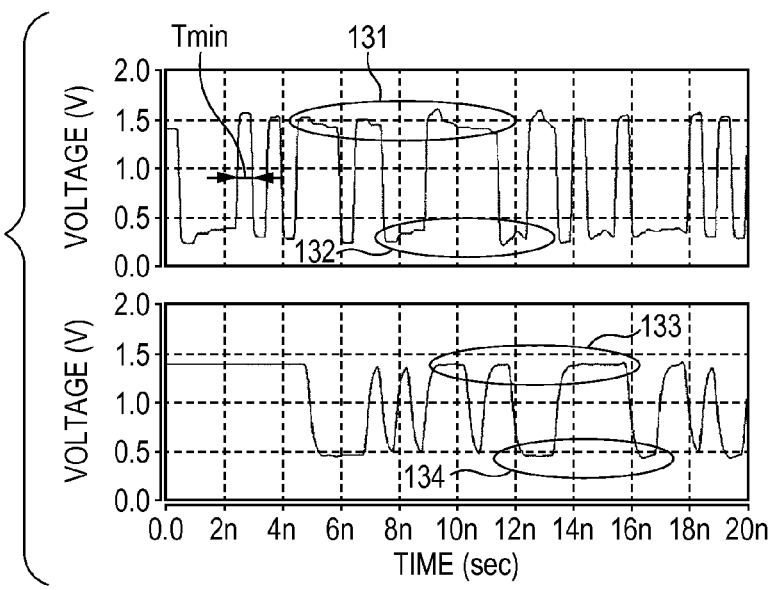
FIGS. 3A, 3B and 3C are graphs respectively indicating simulation results of the printed circuit board according to the first embodiment.

A voltage waveform of the signal according to the computer simulation will be indicated in FIG. 3A. An upper diagram in FIG. 3A is a voltage waveform at the connection point 101$a$. A lower diagram in FIG. 3A is a voltage waveform at the connection point 102$a$ to serve as a receiving end. Portions indicated by ellipse frames 131 and 132 in FIG. 3A indicate a de-emphasis effect. Since the high-frequency component was attenuated by the transmission line at the connection point 102$a$ to serve as the receiving end, the amplitude becomes almost constant as indicated by ellipse frames 133 and 134.

Figure 3B:
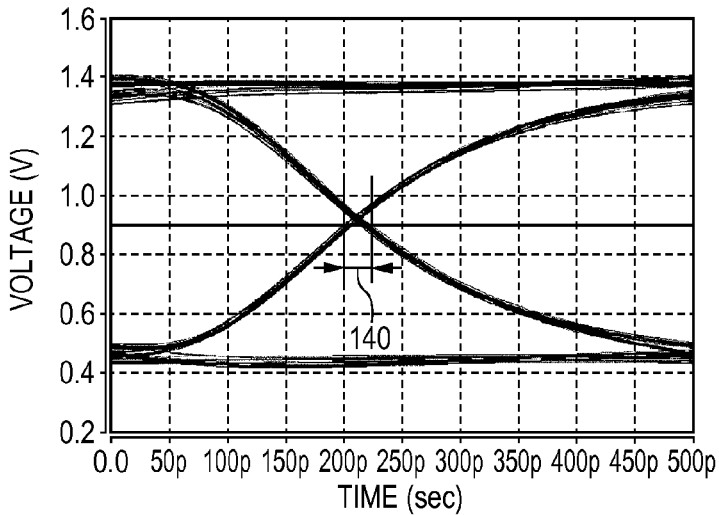

FIG. 3B is a diagram, where the voltage at the connection point 102$a$ to serve as the receiving end is indicated by an eye pattern. The length of the correction line 113 is set such that the signal propagation time Td taken in the correction line 113 becomes such a time of 0.5×Tmin (=250 [psec]). A timing jitter 140 at the threshold voltage 0.9 [V] indicated in FIG. 3B was such a time of 25 [psec].

Figure 3C:
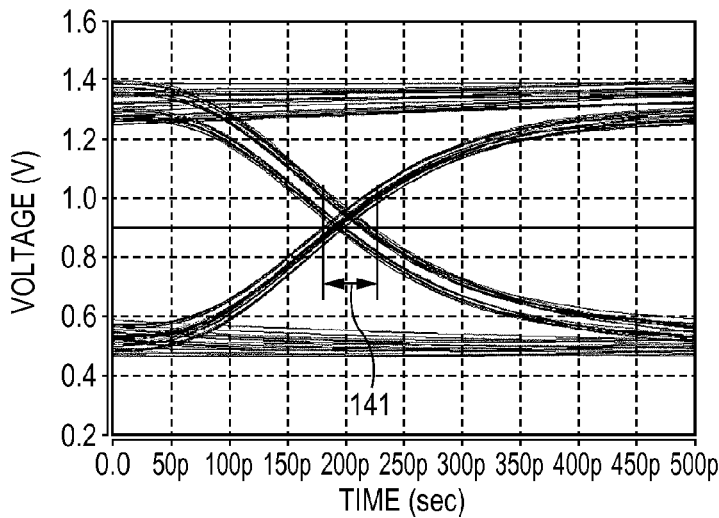

A simulation result of the eye pattern at the connection point 102a, when the signal propagation time Td taken in the correction line 113 was set as 0.5×Tr (=0.5×100 [psec]=50 [psec]) is indicated in FIG. 3C. That is, the length of the correction line 113 is set such that the signal propagation time Td taken in the correction line 113 becomes such a time of 0.5×Tr (=50 [psec]). A timing jitter 141 at the threshold voltage 0.9 [V] indicated in FIG. 3C was such a time of 43 [psec].

Figure 8B:
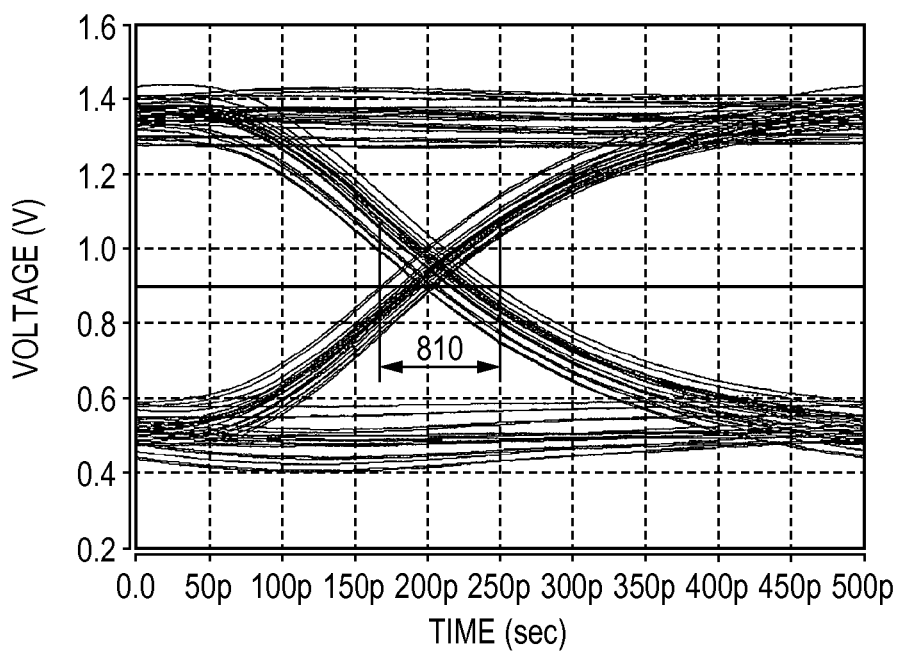

On the other hand, as a comparative example, a computer simulation result of the eye pattern at the connection point 102a when the correction line 113 and the correction resistor 110 are connected with the connection point 102a without changing a circuit constant (this corresponds to Patent Literature 1) is indicated in FIG. 8B. A timing jitter 810 at the threshold voltage 0.9 [V] indicated in FIG. 8B was such a time of 80 [psec].

In a case of this connection, a reflected wave at the receiving end returns to the transmitting end, and a returned signal is also reflected at the transmitting end to be returned to the receiving end again. For that reason, the amplitude at the receiving end does not stabilize. Therefore, levels of the timing jitters 140 and 141 indicated in FIGS. 3B and 3C are lower than a level of the timing jitter 810 indicated in FIG. 8B. Since the timing jitter 800 of a waveform, to which the amplitude correction by the de-emphasis is not performed, indicated in FIG. 8A is 53 [psec], levels of the timing jitters indicated in FIGS. 3B and 3C are lower than a level of the timing jitter 800.

That is, the timing jitter is reduced to a level lower than the levels of the timing jitters in FIGS. 8A and 8B indicated in the comparative example by setting the length of the correction line 113 such that the signal propagation time Td in the correction line 113 satisfies the condition of $0.5 \times Tr \leq Td \leq 0.5 \times Tmin$. In a case where the length of the correction line 113 is set such that the signal propagation time Td satisfies the condition of $0.5 \times Tmin$, the timing jitter can be most effectively reduced. In this manner, an operation margin of a circuit is improved by reducing the timing jitter.

Figure 4A:
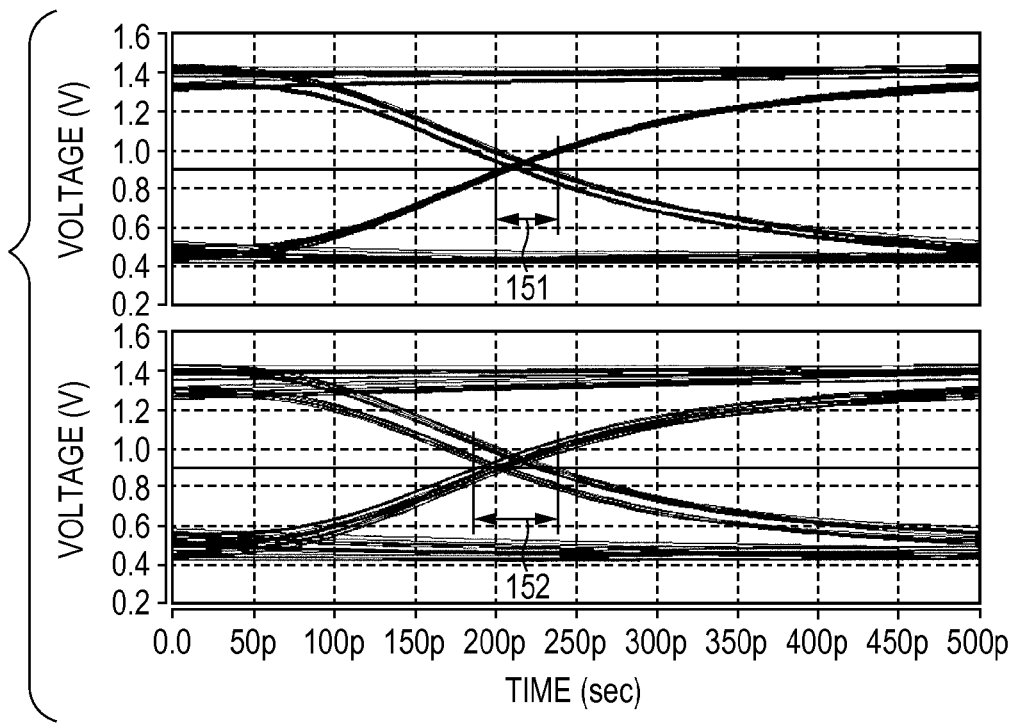
FIGS. 4A and 4B are graphs respectively indicating simulation results of the printed circuit board according to the first embodiment.
Figure 4B:
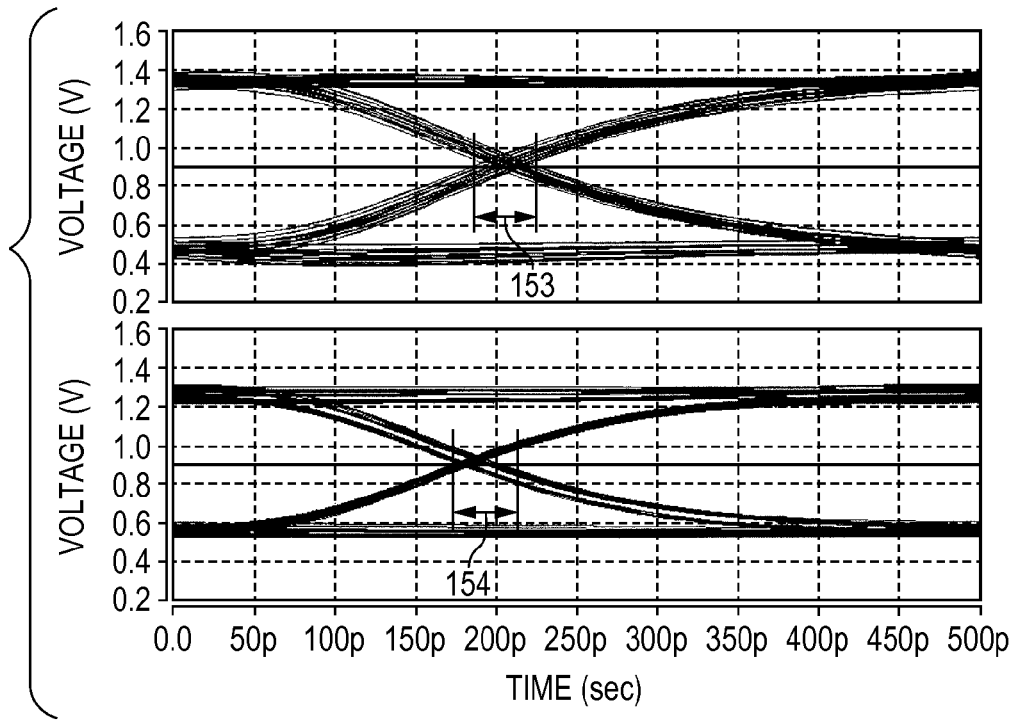

Next, a simulation result of the eye pattern regarding an allowable range of the amplitude ratio $V1'/V1o$ will be indicated in FIGS. 4A and 4B.

In a case where the transmission rate By is 5-percent larger than 0.9, the amplitude ratio $V1'/V1o=0.945$ was realized under the condition of Z113=150 [Ω] and R113=78 [Ω]. The eye pattern at the connection point 102a when the Td is in a state of Td=250 [psec] becomes such a pattern illustrated in an upper diagram in FIG. 4A, and a timing jitter 151 became such a time of 33 [psec]. The eye pattern at the connection point 102a when the Td is in a state of Td=50 [psec] becomes such a pattern illustrated in a lower diagram in FIG. 4A, and a timing jitter 152 became such a time of 50 [psec]. Also in the condition of $V1'/V1o=Bv+5\%$, the condition of Av is also satisfied with the amplitude ratio $V1x/V1o=0.926$.

In a case where the transmission rate Bv is 5-percent smaller than 0.9, the amplitude ratio $V1'/V1o=0.855$ was realized under the condition of Z113=100[Ω] and R113=27 [Ω]. The eye pattern at the connection point 102a when the Td is in a state of Td=250 [psec] becomes such a pattern illustrated in an upper diagram in FIG. 4B, and a timing jitter 153 became such a time of 43 [psec]. The eye pattern at the connection point 102a when the Td is in a state of Td=50 [psec] becomes such a pattern illustrated in a lower diagram in FIG. 4B, and a timing jitter 154 became such a time of 35 [psec]. Also in the condition of $V1'/V1o=Bv\pm5\%$, the condition of Av is also satisfied with the amplitude ratio $V1x/V1o=0.747$.

As above, even in a range of $V1'/V1o=Bv\pm5\%$, the levels of the timing jitters in FIGS. 4A and 4B are more reduced than the levels of the timing jitters 800 and 810 in the comparative example indicated in FIGS. 8A and 8B.

Second Embodiment

Figure 5A:
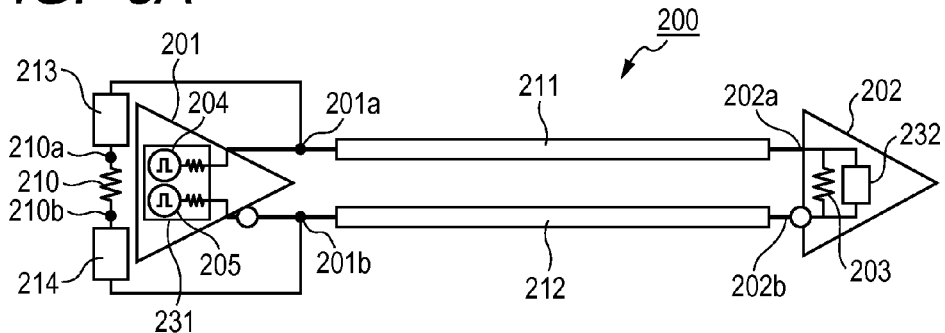
FIGS. 5A, 5B, 5C, 5D and 5E are explanatory diagrams illustrating a schematic constitution of a printed circuit board according to a second embodiment.
Figure 5B:
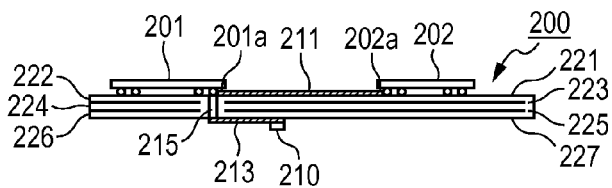
Figure 5C:
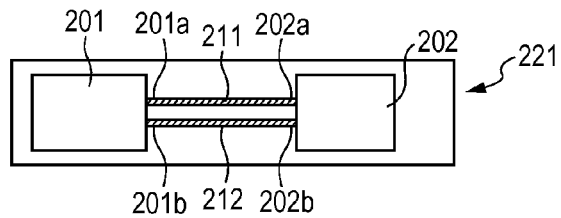
Figure 5D:
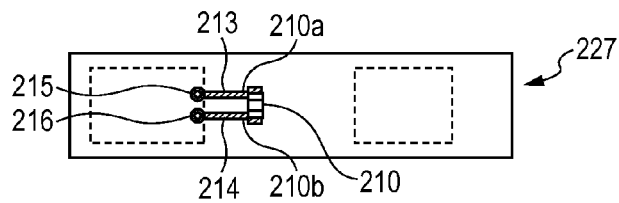
Figure 5E:
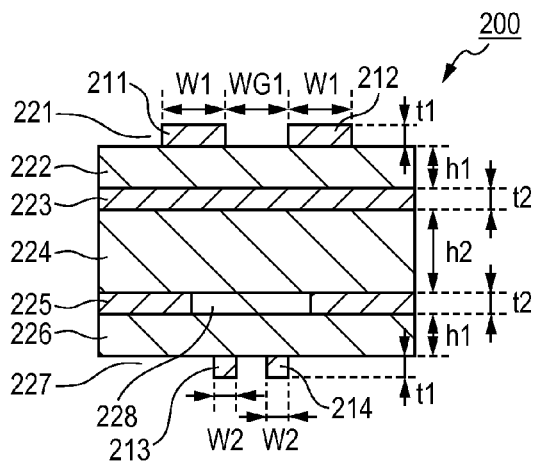

Next, a printed circuit board according to the second embodiment of the present invention will be described in detail. FIGS. 5A, 5B, 5C, 5D and 5E are explanatory diagrams illustrating a schematic constitution of a printed circuit board according to the second embodiment of the present invention. FIG. 5A illustrates an equivalent circuit of the printed circuit board. FIG. 5B is a cross-sectional view illustrated along the direction parallel with a main transmission line of the printed circuit board and FIGS. 5C and 5D are plan views of signal wiring layers of the printed circuit board. FIG. 5E is a cross-sectional view illustrated along the direction orthogonal to the main transmission line of the printed circuit board.

As indicated in FIG. 5A, a printed circuit board 200 has a differential transmission device 201, which has a built-in transmission circuit 231 for transmitting two differential signals and a differential receiving device 202, which has a built-in receiving circuit 232 for receiving two differential signals. The transmission circuit 231 of the differential transmission device 201 has a first output terminal for outputting one differential signal and a second output terminal for outputting the other differential signal. In addition, the receiving circuit 232 of the differential receiving device 202 has a first input terminal for inputting one differential signal and a second input terminal for inputting the other differential signal.

The two differential signals are digital signals which are switched to a high level or a low level of the voltage, and are signals of which phases are 180-degree different from each other. That is, when one differential signal is switched to a high level, the other differential signal is switched to a low level, and when the one differential signal is switched to a low level, the other differential signal is switched to a high level.

The printed circuit board 200 has a transmission line 211 serving as a first main transmission line, through which one differential signal is propagated, and a transmission line 212 serving as a second main transmission line, through which the other differential signal is propagated. Therefore, the printed circuit 200 adopts a differential transmission system.

The transmission circuit 231 is represented by an equivalent circuit constituted that a signal source 204, which has the internal resistance and outputs one differential signal, is connected to the first output terminal and an equivalent circuit constituted that a signal source 205, which has the internal resistance and outputs the other differential signal, is connected to the second output terminal.

The first output terminal of the transmission circuit 231 is connected with one end of the transmission line 211 at a connection point 201a. The second output terminal of the transmission circuit 231 is connected with one end of the transmission line 212 at a connection point 201b.

The first input terminal of the receiving circuit 232 is connected with the other end of the transmission line 211 at a connection point 202a. The second input terminal of the receiving circuit 232 is connected with the other end of the transmission line 212 at a connection point 202b. Respective two differential signals transmitted from the transmission circuit 231 are propagated through the transmission lines 211 and 212 respectively and received by the receiving circuit 232.

The differential receiving device 202 has a built-in terminating resistor 203, of which one end is connected to the connection point 202a and the other end is connected to the connection point 202b. Incidentally, the terminating resistor 203 may be arranged on a signal wiring layer as a separate member separated from the differential receiving device 202.

The differential impedances of the transmission lines 211 and 212 generally vary within a range of ±10% of a designed value due to dispersion in a manufacturing process. For that reason, an error range of a resistance value of the terminating resistor 203 is allowed within a range of ±10% for the differential impedances of the transmission lines 211 and 212.

In the second embodiment, the printed circuit board 200, which is provided at a side of the transmission circuit 231, has a correction line 213 serving as a first sub transmission line connected to the connection point 201a. In addition, the printed circuit board 200, which is provided at a side of the transmission circuit 231, has a correction line 214 serving as a second sub transmission line connected to the connection point 201b. Also, the printed circuit board 200 has a correction resistor 210 acts as a resistor connected between the correction line 213 and the correction line 214.

When it is specifically described, one end of the correction line 213 is connected to the connection point 201a, where a first output terminal of the transmission circuit 231 is connected with one end of the transmission line 211. In addition, one end of the correction line 214 is connected to the connection point 201b, where a second output terminal of the transmission circuit 231 is connected with one end of the transmission line 212. And, the correction resistor 210 is connected between the other ends of the respective correction lines 213 and 214. That is, the other end of the correction line 213 is connected with one end of the correction resistor 210 at a connection point 210a, and the other end of the correction line 214 is connected with the other end of the correction resistor 210 at a connection point 210b.

Next, the structure of the printed circuit board 200 will be described with reference to FIGS. 5B, 5C and 5D. The printed circuit board 200 is formed to have the laminated structure, where insulating layers 222, 224 and 226 are respectively placed between a signal wiring layer 221 and a ground layer 223, between the ground layer 223 and a power supply layer 225, and between the power supply layer 225 and a signal wiring layer 227. In the second embodiment, the signal wiring layer 221 is an upper surface layer, the signal wiring layer 227 is a rear surface layer, and the ground layer 223, the power supply layer 225 and the insulating layers 222, 224 and 226 are interlayers.

The differential transmission device 201, the differential receiving device 202 and the transmission lines 211 and 212 are arranged on the signal wiring layer 221, which is an upper surface layer, as indicated in FIGS. 5B and 5C. The correction resistor 210 and the correction lines 213 and 214 are arranged on the signal wiring layer 227, which is a rear surface layer, as indicated in FIGS. 5B and 5D.

The connection between the differential transmission device 201 and the correction line 213 is completed through a VIA 215. Similarly, the connection between the differential transmission device 201 and the correction line 214 is completed through a VIA 216. Incidentally, it is omitted to illustrate the VIA 215 and the VIA 216 in FIG. 5A.

Next, the layer structure of the printed circuit board 200 will be described with reference to FIG. 5E. The transmission lines 211 and 212 are arranged on the signal wiring layer 221 of which thickness is t1. The thickness of the insulating layer 222 is h1. The thickness of the ground layer 223 is t2. The thickness of the insulating layer 224 is h2. The thickness of the power supply layer 225 is t2. The thickness of the insulating layer 226 is h1. The correction lines 213 and 214 are arranged on the signal wiring layer 227 of which thickness is t1.

An aperture 228 is formed at a position, where the power supply layer 225 is opposite to the correction lines 213 and 214, and the inside of the aperture 228 is filled up with an insulator having the same quality as that of the insulating layer 224. Therefore, an impedance reference plane of the correction lines 213 and 214 becomes the ground layer 223.

Next, it will be described about a principle, by which the timing jitter in the printed circuit board 200 of the second embodiment is reduced. It is defined that a value of internal resistance (output impedance) of the signal source 204 of the transmission circuit 231 indicated in FIG. 5A is represented by R204 [Ω]. It is defined that a value of internal resistance (output impedance) of the signal source 205 of the transmission circuit 231 is represented by R205 [Ω].

In addition, it is defined that an impedance value of the transmission line 211 is represented by Z211 [Ω], an impedance value of the transmission line 212 is represented by Z212 [Ω], an impedance value of the correction line 213 is represented by Z213 [Ω], an impedance value of the correction line 214 is represented by Z214 [Ω]. Also, it is defined that a resistance value of the correction resistor 210 is represented by R210 [Ω] and a resistance value of the terminating resistor 203 is represented by R203 [Ω].

Relationship between respective parameters is premised that $0.5 \times R203 = Z211 = Z212$, $Rq \leq Z213$, $Rs \leq Z214$, $0.5 \times R210 < Z213$, and $0.5 \times R210 < Z214$. Here, Rq denotes a parallel impedance value obtained from the impedance value Z211 of the transmission line 211 and the impedance value R204 of the signal source 204 in the transmission device 201, and the Rq is expressed by an expression of $Rq = (Z211 \times R204)/(Z211 + R204)$. And, Rs denotes a parallel impedance value obtained from the impedance value Z212 of the transmission line 212 and the impedance value R205 of the signal source 205 in the transmission device 201, and the Rs is expressed by an expression of $Rs = (Z212 \times R205)/(Z212 + R205)$.

That is, the impedance value Z213 of the correction line 213 is set to become equal to or larger than the parallel impedance value Rq obtained from the impedance value R204 of the signal source 204 in the transmission device 201 and the impedance value Z211 of the transmission line 211. The impedance value Z214 of the correction line 214 is set to become equal to or larger than the parallel impedance value Rs obtained from the impedance value R205 of the signal source 205 in the transmission device 201 and the impedance value Z212 of the transmission line 212. In addition, a value obtained by multiplying the resistance value R210 of the correction resistor 210 by 0.5 is set to become lower than the impedance value Z213 of the correction line 213. A value obtained by multiplying the resistance value R210 of the correction resistor 210 by 0.5 is set to become lower than the impedance value Z214 of the correction line 214. In addition, a vale obtained by multiplying the resistance value R203 of the terminating resistor 203 by 0.5 is set to become equal to the impedance values Z211 and Z212 of the transmission lines 211 and 212.

Here, in the second embodiment, if it is considered that FIG. 5A indicates a system of an ideal differential transmission, a middle point of the correction resistor 210 and a middle point of the terminating resistor 203 become the virtual ground. Therefore, a principle of de-emphasis can be considered similar to a case of a single-ended transmission system.

Here, it is defined that a reflection coefficient when a signal, which propagates through the correction line 213 from the connection point 210a (the other end) to the connection point 201a (one end), reflects at the connection point 201a (one end) is represented by γ1. It is defined that a reflection coefficient when a signal, which propagates through the correction line 213 from the connection point 201a (one end) to the connection point 210a (the other end), reflects at the connection point 210a (the other end) is represented by γ2.

It is defined that a reflection coefficient when a signal, which propagates through the correction line 214 from the connection point 210b (the other end) to the connection point 201b (one end), reflects at the connection point 201b (one end) is represented by γ3. It is defined that a reflection coefficient when a signal, which propagates through the correction line 214 from the connection point 201b (one end) to the connection point 210b (the other end), reflects at the connection point 210b (the other end) is represented by γ4.

The reflection coefficients γ1 and γ3 are expressed by the following expressions (9) and (10).

$$\gamma1=(Rq-Z213)/(Rq+Z213) \quad (9)$$

$$\gamma3=(Rs-Z214)/(Rs+Z214) \quad (10)$$

However, the Rq and Rs are expressed that $Rq=(Z211 \times R204)/(Z211+R204)$, and $Rs=(Z212 \times R205)/(Z212+R205)$.

Since a middle point of the correction resistor 210 becomes the virtual ground, the reflection coefficients γ2 and γ4 are expressed by the following expressions (11) and (12).

$$\gamma2=(0.5 \times R210-Z213)/(0.5 \times R210+Z213) \quad (11)$$

$$\gamma4=(0.5 \times R210-Z214)/(0.5 \times R210+Z214) \quad (12)$$

Generally, the reflection coefficients γ1 and γ3 are in such ranges of $-1 \leq \gamma1 \leq 1$ and $-1 \leq \gamma3 \leq 1$, however, in the present embodiment, since the Rq is set as $Rq \leq Z213$, the γ1 is in such a range of $-1 < \gamma1 \leq 0$. Since the Rs is set as $Rs \leq Z214$, the γ3 is in such a range of $-1 < \gamma3 \leq 0$. Generally, the reflection coefficients γ2 and γ4 are in such ranges of $-1 \leq \gamma2 \leq 1$ and $-1 \leq \gamma4 \leq 1$, however, since the R210 and the Z213 are set as $0.5 \times R210 < Z213$, the γ2 is in such a range of $-1 < \gamma2 < 0$. Since the R210 and the Z214 are set as $0.5 \times R210 < Z214$, the γ4 is in such a range of $-1 < \gamma4 < 0$.

Here, in the second embodiment, if it is considered that FIG. 5A indicates a system of an ideal differential transmission, since a middle point of the correction resistor 210 and a middle point of the terminating resistor 203 become the virtual ground, an effect of the de-emphasis can be obtained by a principle similar to that of the single-ended transmission system. Since it is operated by the similar principle at the connection point 201b except for the fact that the connection point 201a and a phase of the signal are reversed, an effect of the de-emphasis is obtained as a differential signal.

It is defined that the minimum pulse width of a differential signal transmitted by the transmission circuit 231 is represented by Tmin [sec] and a rise time of the differential signal transmitted by the transmission circuit 231 is represented by Tr [sec]. In addition, it is defined that a signal propagation time required in that the signal propagates through each of the correction lines 213 and 214 from one end to the other end is represented by Td. The length of each of the correction lines 213 and 214 may be set such that the signal propagation time Td in each of the correction lines 213 and 214 satisfies the condition of $0.5 \times Tr \leq Td \leq 0.5 \times Tmin$.

In the second embodiment, since a differential transmission system is adopted, the correction resistor 210 can be shared by the two correction lines 213 and 214. In case of the single-ended transmission system, the termination voltage is required to be supplied in order to terminate the correction resistor, however, in the second embodiment, since it is a form of the differential termination, the termination voltage is not required to be supplied.

In a case where a rise time of each of the differential signals, which are output by the signal sources 204 and 205, or the minimum pulse width is in an unbalanced state, a signal propagation time is adjusted by adjusting the length of the correction lines 213 and 214, and a balanced state can be obtained.

When it is defined that a dielectric constant of an insulator of the insulating layers 222, 224 and 226 is represented by $\in r$ and the length of the correction lines 213 and 214 is represented by Len, since the length Len is expressed by an expression of $Len \approx (co/\sqrt{\in r}) \times Td$, when a value of the signal propagation time Td is determined, the length Len of the correction lines 213 and 214 can be calculated. By setting the length of the correction lines 213 and 214 to this calculated value, an effect of the de-emphasis can be obtained.

Therefore, the de-emphasis function can be realized by the passive components similar to a case of the above-described first embodiment. And, even if an output impedance of the transmission circuit 231 is not matching with an impedance of the transmission line 211 (212), the timing jitter of a signal, which is received in the receiving circuit 232, is reduced.

Next, the relationship between the impedance values Z213 and Z214 of the correction lines 213 and 214 and the resistance value R210 of the correction resistor 210 will be described. The idea of this embodiment is similar to that of the above-described first embodiment.

Similar to a case of the above-described first embodiment, a transmission rate Bv of a signal in each of the transmission lines 211 and 212 can be calculated from a ratio between the minimum voltage and the maximum voltage at a cross-point vicinity of the eye pattern at a receiving end when a counterplan by the de-emphasis is not taken. And, similar to a case of the above-described first embodiment, a ratio Av expressed by a fraction, of which a denominator is the width of an output saturation voltage of the transmission circuit 231 and a numerator is the width of an input threshold voltage of the receiving circuit 232, can be calculated.

For example, as for the LVDS (Low Voltage Differential Signaling) representative as a differential transmission device, the differential input threshold voltage is ±100 [mV] for the differential output voltage ±350 [mV]. In this case, the ratio Av becomes about 0.29. And, the ratio Av is smaller than the transmission rate Bv.

The impedance values Z213 and Z214 of the correction lines 213 and 214 and the resistance value R210 of the correction resistor can be set by using the transmission rate Bv and the ratio Av.

According to the above description, under the condition of $0 < Av < Bv < 1$, the impedance values Z213 and Z214 and the resistance value R210 are set within a range where the reflection coefficients γ1, γ2, γ3 and γ4 become such values of satisfying the conditions of the following expressions (13), (14), (15) and (16).

$$(1+\gamma2)/(1-\gamma1 \times \gamma2) \geq Av \quad (13)$$

$$(1+\gamma4)/(1-\gamma3 \times \gamma4) \geq Av \quad (14)$$

$$1+\gamma2+\gamma1 \times \gamma2 = Bv \pm 5\% \quad (15)$$

$$1+\gamma4+\gamma3 \times \gamma4 = Bv \pm 5\% \quad (16)$$

Either one of the impedance values Z213 and Z214 and the resistance value R210 is not uniquely determined, but the impedance values Z213 and Z214 and the resistance value R210 are adjusted each other so as to satisfy the above conditions of the Av and the Bv.

Here, the impedance values Z211 and Z212 of the single-ended transmission lines 211 and 212 are generally determined as Z211, Z212≈{60/√(0.475∈r+0.67)}×ln {4×h1/(0.67(0.8×W1+t1))} [Ω].

When the impedance values Z211 and Z212 are in a state of Z211=Z212=Zo, a differential impedance Zdiff is expressed by an expression of Zdiff≈2Zo{1−0.48×exp(−0.96×WG1/h1)} [Ω].

As above, in the second embodiment, a function of the de-emphasis can be realized by the passive components similar to a case of the above-described first embodiment. And, even if an output impedance of the transmission circuit 231 is not matching with the impedances of the transmission lines 211 and 212, a timing jitter due to the intersymbol interference is reduced.

Third Embodiment

Figure 6A:
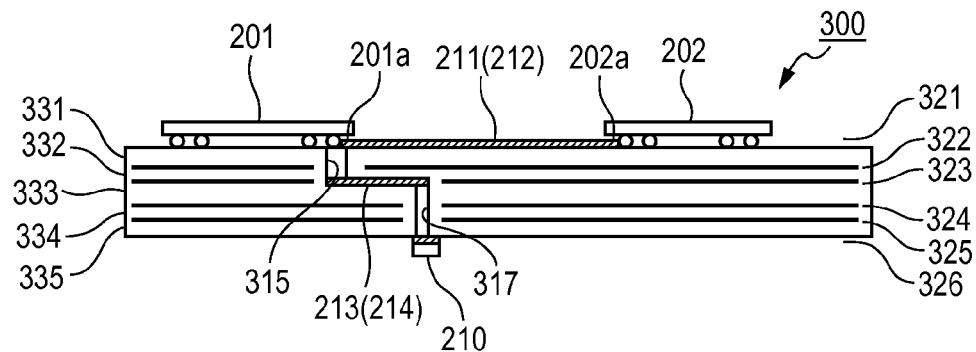
FIGS. 6A, 6B and 6C are explanatory diagrams illustrating a schematic constitution of a printed circuit board according to a third embodiment.
Figure 6B:
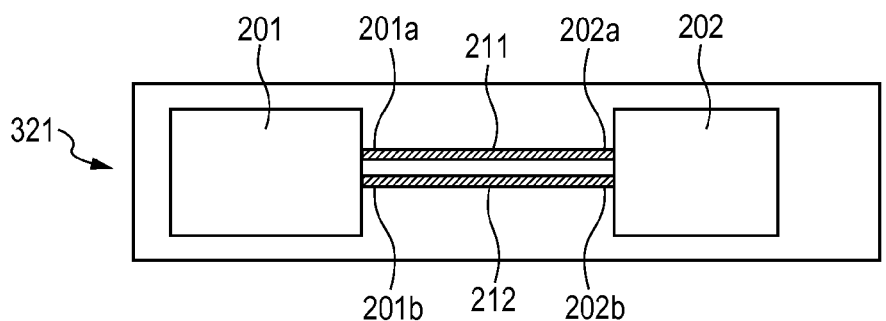
Figure 6C:
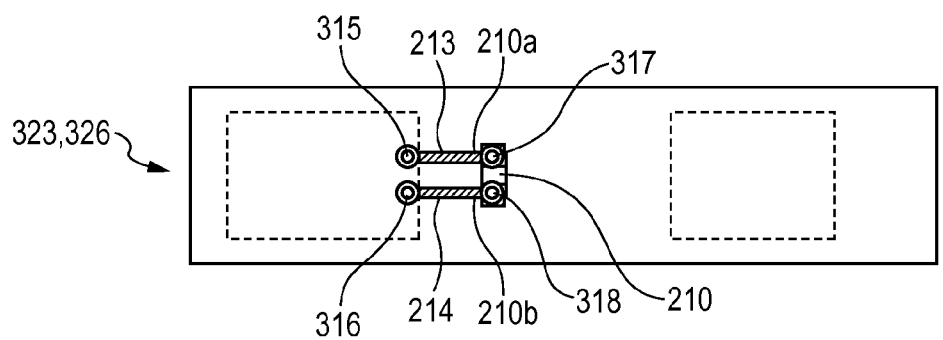

Next, a printed circuit board according to the third embodiment of the present invention will be described. FIGS. 6A, 6B and 6C are views illustrating the printed circuit board of the third embodiment. An equivalent circuit of the printed circuit board indicated in FIGS. 6A, 6B and 6C is the same as that of the printed circuit board indicated in FIG. 5A, and the constituents which are the same as those in the second embodiment are denoted by the same reference numerals and the description thereof will be omitted.

In the above-described first and second embodiments, a case where the correction line serving as a sub transmission line was arranged on a signal wiring layer which is a rear surface layer has been described, however, in the third embodiment, a case where a correction line serving as a sub transmission line is arranged on a signal wiring layer which is an interlayer will be described. Hereinafter, a case where an equivalent circuit of the printed circuit board is the same as that in the second embodiment will be described, however the present embodiment can be also applied to a case where an equivalent circuit of the printed circuit board is the same as that in the first embodiment.

Hereinafter, the structure of a printed circuit board 300 will be described. As illustrated in FIG. 6A, the printed circuit board 300 is formed to have the laminated structure, where insulating layers 331, 332, 333, 334 and 335 are respectively placed between a signal wiring layer 321 and a ground layer 322, between the ground layer 322 and a signal wiring layer 323, between the signal wiring layer 323 and a signal wiring layer 324, between the signal wiring layer 324 and a power supply layer 325, and between the power supply layer 325 and a signal wiring layer 326. In the third embodiment, the signal wiring layer 321 is an upper surface layer, the signal wiring layer 326 is a rear surface layer and other layers 322, 323, 324, 325, 331, 332, 333, 334 and 335 are interlayers.

As illustrated in FIG. 6B, a differential transmission device 201 and a differential receiving device 202 are arranged on the signal wiring layer 321 serving as the upper surface layer and transmission lines 211 and 212 serving as main transmission lines are also arranged on the signal wiring layer 321. As illustrated in FIG. 6C, a correction resistor 210 serving as a resistor is arranged on the signal wiring layer 326 serving as the rear surface layer.

Correction lines 213 and 214 serving as sub transmission lines are arranged on the signal wiring layer 323 serving as an interlayer. The connection between the differential transmission device 201 and the correction line 213 is completed through a VIA 315. The connection between the differential transmission device 201 and the correction line 214 is completed through a VIA 316. The connection between the correction line 213 and the correction resistor 210 is completed through a VIA 317. The connection between the correction line 214 and the correction resistor 210 is completed through a VIA 318.

Also in the third embodiment, an effect of reducing a timing jitter is obtained similar to a case of the above-described first embodiment.

Fourth Embodiment

Figure 7A:
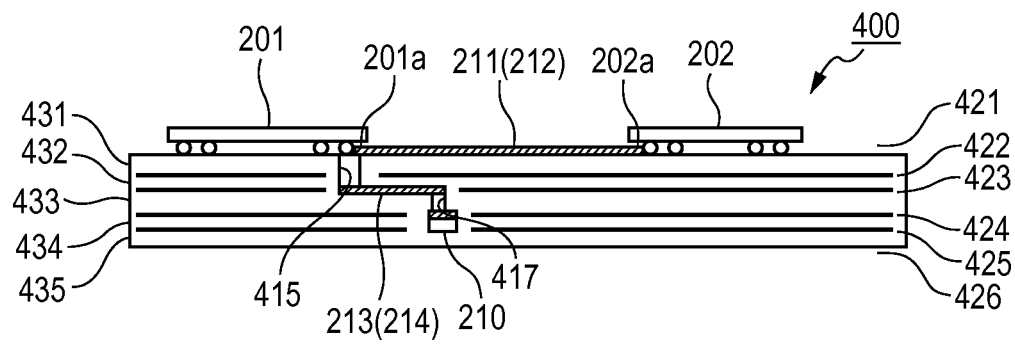
FIGS. 7A, 7B and 7C are explanatory diagrams illustrating a schematic constitution of a printed circuit board according to a fourth embodiment.
Figure 7B:
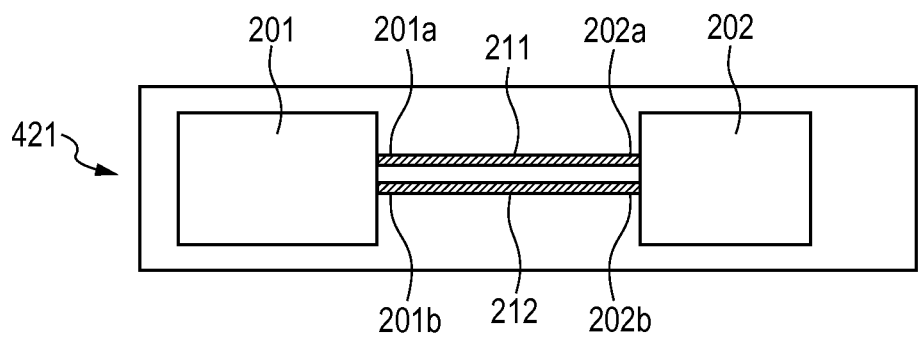
Figure 7C:
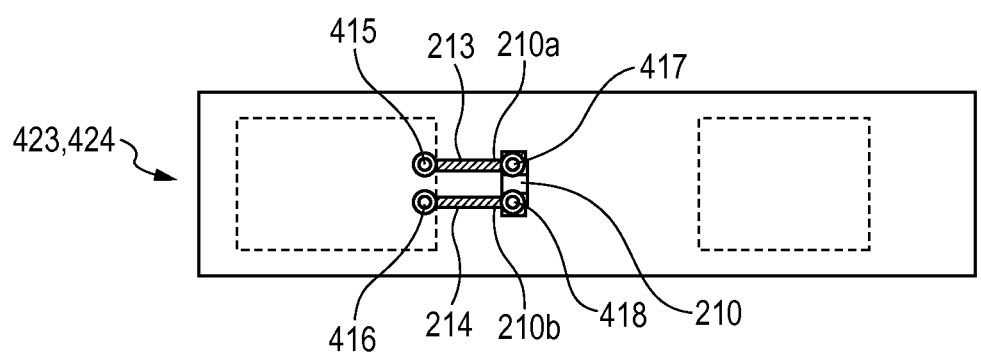

Next, a printed circuit board according to the fourth embodiment of the present invention will be described. FIGS. 7A, 7B and 7C are views illustrating the printed circuit board of the fourth embodiment. An equivalent circuit of the printed circuit board indicated in FIGS. 7A, 7B and 7C is the same as that of the printed circuit board indicated in FIG. 5A, and the constituents which are the same as those in the second embodiment are denoted by the same reference numerals and the description thereof will be omitted.

In the above-described first and second embodiments, the case where the correction line serving as a sub transmission line was arranged on a signal wiring layer which is a rear surface layer has been described, however, in the fourth embodiment, a case where the correction line serving as a sub transmission line and a correction resistor serving as a resistor are arranged on a signal wiring layer which is an interlayer will be described. Hereinafter, a case where an equivalent circuit of the printed circuit board is the same as that in the second embodiment will be described, however the present embodiment can be also applied to a case where an equivalent circuit of the printed circuit board is the same as that in the first embodiment.

Hereinafter, the structure of a printed circuit board 400 will be described. As illustrated in FIG. 7A, the printed circuit board 400 is formed to have the laminated structure, where insulating layers 431, 432, 433, 434 and 435 are respectively placed between a signal wiring layer 421 and a ground layer 422, between the ground layer 422 and a signal wiring layer 423, between the signal wiring layer 423 and a signal wiring layer 424, between the signal wiring layer 424 and a power supply layer 425 and between the power supply layer 425 and a signal wiring layer 426. In the fourth embodiment, the signal wiring layer 421 is an upper surface layer and the signal wiring layer 426 is a rear surface layer and other layers 422, 423, 424, 425, 431, 432, 433, 434 and 435 are interlayers.

As illustrated in FIG. 7B, a differential transmission device 201 and a differential receiving device 202 are arranged on the signal wiring layer 421 serving as the upper surface layer and transmission lines 211 and 212 serving as main transmission lines are also arranged on the signal wiring layer 421. As illustrated in FIGS. 7A and 7C, correction lines 213 and 214 serving as sub transmission lines are arranged on the signal wiring layer 423 serving as an interlayer, and a correction resistor 210 serving as a resistor is arranged on the signal wiring layer 424 serving as an interlayer.

The connection between the differential transmission device 201 and the correction line 213 is completed through a VIA 415. The connection between the differential transmission device 201 and the correction line 214 is completed through a VIA 416. The connection between the correction line 213 and the correction resistor 210 is completed through a VIA 417. The connection between the correction line 214 and the correction resistor 210 is completed through a VIA 418.

Also in the fourth embodiment, an effect of reducing a timing jitter is obtained similar to a case of the above-described first embodiment.

While the present invention has been described with reference to the exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-234734, filed Oct. 19, 2010, which is hereby incorporated by reference herein in its entirety.

What is claimed is:

1. A printed circuit board comprising:
a transmission circuit configured to transmit a signal;
a receiving circuit configured to receive a signal;
a main transmission line configured to connect the transmission circuit and the receiving circuit to each other and propagate a signal from the transmission circuit to the receiving circuit;
a sub transmission line, one end thereof being connected to a connection point between the transmission circuit and the main transmission line, and an impedance value thereof being equal to or higher than a parallel impedance value of an output impedance value of the transmission circuit and an impedance value of the main transmission line; and
a resistor connected to the other end of the sub transmission line, resistance thereof being lower than the impedance value of the sub transmission line,
wherein the sub transmission line has a length which satisfies $0.5 \times Tr \leq Td \leq 0.5 \times Tmin$,
where Td is a signal propagation time required to propagate the signal from the one end to the other end of the sub transmission line,
Tmin is a minimum pulse width of the signal transmitted by the transmission circuit, and
Tr is a rise time of the signal transmitted by the transmission circuit.

2. The printed circuit board according to claim 1, wherein $0 < Av < Bv < 1$, $(1+\gamma 2)/(1-\gamma 1 \times \gamma 2) \geq Av$, and $1+\gamma 2+\gamma 1 \times \gamma 2 = Bv \pm 5\%$ are satisfied,
where Av is a ratio of a denominator being a width of an output saturation voltage of the transmission circuit to a numerator being a width of an input threshold voltage of the receiving circuit,
Bv is a transmission rate of the signal on the main transmission line,
$\gamma 1$ is a reflection coefficient at a time when the signal propagated from the other end to the one end of the sub transmission line is reflected at the one end, and
$\gamma 2$ is a reflection coefficient at a time when the signal propagated from the one end to the other end of the sub transmission line is reflected at the other end.

3. A printed circuit board comprising:
a transmission circuit having first and second terminals, configured to transmit a differential signal;
a receiving circuit having first and second terminals, configured to receive a differential signal;
a first main transmission line and a second main transmission line, each configured to connect the transmission circuit and the receiving circuit to each other and propagate a differential signal;
a first sub transmission line, one end thereof being connected to a connection point between the first terminal of the transmission circuit and the first main transmission line, and an impedance value thereof being equal to or higher than a parallel impedance value of an output impedance value of the first terminal of the transmission circuit and an impedance value of the first main transmission line;
a second sub transmission line, one end thereof being connected to a connection point between the second terminal of the transmission circuit and the second main transmission line, and an impedance value thereof being equal to or higher than a parallel impedance value of an output impedance value of the second terminal of the transmission circuit and an impedance value of the second main transmission line; and
a resistor connected between the other ends of the first and second sub transmission lines, resistance thereof being lower than twice as much as the impedance value of each of first and second sub transmission lines,
wherein the sub transmission line has a length which satisfies $0.5 \times Tr \leq Td \leq 0.5 \times Tmin$,
where Td is a signal propagation time required to propagate the signal from the one end to the other end of the sub transmission line,
Tmin is a minimum pulse width of the signal transmitted by the transmission circuit, and
Tr is a rise time of the signal transmitted by the transmission circuit.

4. The printed circuit board according to claim 3, wherein $0 < Av < Bv < 1$, $(1+\gamma 2)/(1-\gamma 1 \times \gamma 2) \geq Av$, $(1+\gamma 4)/(1-\gamma 3 \times \gamma 4) \geq Av$, $1+\gamma 2+\gamma 1 \times \gamma 2 = Bv \pm 5\%$, and $1+\gamma 4+\gamma 3 \times \gamma 4 = Bv \pm 5\%$ are satisfied,
where Av is a ratio of a denominator being a width of an output saturation voltage of the transmission circuit to a numerator being a width of an input threshold voltage of the receiving circuit,
Bv is a transmission rate of the signal on the main transmission line,
$\gamma 1$ is a reflection coefficient at a time when the signal propagated from the other end to the one end of the first sub transmission line is reflected at the one end,
$\gamma 2$ is a reflection coefficient at a time when the signal propagated from the one end to the other end of the first sub transmission line is reflected at the other end,
$\gamma 3$ is a reflection coefficient at a time when the signal propagated from the other end to the one end of the second sub transmission line is reflected at the one end, and
$\gamma 4$ is a reflection coefficient at a time when the signal propagated from the one end to the other end of the second sub transmission line is reflected at the other end.

* * * * *